(12) United States Patent
Mandic et al.

(10) Patent No.: US 11,467,612 B2
(45) Date of Patent: Oct. 11, 2022

(54) METHOD AND APPARATUS FOR PULSE FREQUENCY MODULATION WITH DISCONTINUOUS VOLTAGE SENSING

(71) Applicant: Renesas Electronics America Inc., Milpitas, CA (US)

(72) Inventors: Ratko Mandic, Cary, NC (US); John Fogg, Cary, NC (US); Julian Zhu, Cary, NC (US); Daniel Zheng, Morrisville, NC (US)

(73) Assignee: Renesas Eledctronics America Inc., Milpitas, CA (US)

( * ) Notice: Subject to any disclaimer, the term of this patent is extended or adjusted under 35 U.S.C. 154(b) by 130 days.

(21) Appl. No.: 16/921,876

(22) Filed: Jul. 6, 2020

(65) Prior Publication Data
US 2021/0011503 A1    Jan. 14, 2021

Related U.S. Application Data

(60) Provisional application No. 62/872,136, filed on Jul. 9, 2019.

(51) Int. Cl.
| | | |
|---|---|---|
| G05F 1/00 | (2006.01) | |
| G05F 1/52 | (2006.01) | |
| H02J 7/00 | (2006.01) | |
| H03K 5/24 | (2006.01) | |
| G01R 15/06 | (2006.01) | |
| H03K 5/00 | (2006.01) | |
| H02J 7/34 | (2006.01) | |

(52) U.S. Cl.
CPC ............... *G05F 1/52* (2013.01); *G01R 15/06* (2013.01); *H02J 7/0068* (2013.01); *H03K 5/24* (2013.01); *H02J 7/345* (2013.01); *H02J 2207/50* (2020.01); *H03K 2005/00045* (2013.01)

(58) Field of Classification Search
CPC .. H02M 3/156; H02M 3/1588; H02M 3/1584; H02M 3/158; Y02B 70/1466
USPC .......................................................... 323/282
See application file for complete search history.

(56) References Cited

U.S. PATENT DOCUMENTS 5,798,635 A * 8/1998 Hwang ............... H02M 1/4225
   323/222
5,912,552 A * 6/1999 Tateishi ............. H02M 3/1588
   323/285

(Continued)

*Primary Examiner* — Quan Tra
(74) *Attorney, Agent, or Firm* — Foley & Lardner LLP

(57) ABSTRACT

Exemplary embodiments may include a method of applying a charging pulse to an output capacitor, detecting satisfaction of a charging threshold, ending the charging pulse in response to the detecting the satisfaction of the charging threshold, and discharging the sampling capacitor in response to the detecting the satisfaction of the charging threshold. In some embodiments, once a sampling capacitor voltage drops below a discharging threshold, a charging pulse is applied. Exemplary embodiments may also include an apparatus with a controller coupled to an input node, a timer coupled to the controller, an inductive charger coupled to the controller, to an input node, and to an output node, and a sensor coupled to the controller and the output node. Exemplary embodiments may further include an apparatus where a sensor with a sampling capacitor has a first terminal coupled to the output node and a second terminal coupled to the controller and the inductive charger.

14 Claims, 5 Drawing Sheets

(56) References Cited

U.S. PATENT DOCUMENTS

| | | | | |
|---|---|---|---|---|
| 6,094,362 | A * | 7/2000 | Domingo | H02M 1/32 363/21.15 |
| 6,958,594 | B2 * | 10/2005 | Redl | H02M 3/156 323/282 |
| 8,198,880 | B2 * | 6/2012 | Ouyang | H02M 3/156 323/284 |
| 2011/0148379 | A1 * | 6/2011 | Gu | H02M 3/156 323/284 |
| 2013/0063102 | A1 * | 3/2013 | Chen | H02M 3/157 323/234 |

* cited by examiner

METHOD AND APPARATUS FOR PULSE FREQUENCY MODULATION WITH DISCONTINUOUS VOLTAGE SENSING

CROSS-REFERENCE TO RELATED PATENT APPLICATIONS

This application claims priority to U.S. Provisional Patent Application Ser. No. 62/872,136 entitled "PFM FOR DC-DC REGULATORS WITH DISCONTINUOUS VOUT SENSING AND ADJUSTABLE MINIMUM INPUT POWER CONSUMPTION," filed Jul. 9, 2019, the contents of such application being hereby incorporated by reference in its entirety and for all purposes as if completely and fully set forth herein.

TECHNICAL FIELD

The present embodiments relate generally to electrical power supplies, and more particularly to a method and apparatus for pulse frequency modulation with discontinuous voltage sensing.

BACKGROUND

DC-DC converters sometimes use discontinuous output voltage sensing. Examples include "high side" buck and "primary sensing" flyback topologies. These topologies can be used with universal AC input voltage (e.g., 85V AC to 265V AC) where low "standby" and "no load" input power consumption ($P_{IN,min}$) may be regulated and mandated by national and international standards. Pulse frequency modulation ("PFM") in systems using continuous output voltage sensing can demonstrate desirable efficiency under light electrical load. A light-load efficiency may enable low minimum input power ("$P_{IN,min}$") for more efficient low power or "standby" modes for electrical or electronic devices. However, discontinuous VOUT sensing impacts usage of PFM operation, because PFM systems compatible with continuous VOUT sensing are not compatible with discontinuous VOUT sensing. Two types of parts and configurations are conventionally available. First, parts that can achieve low PIN must operate with large COUT (optimized for low PIN only). Second, parts that cannot achieve low PIN while in operation use small COUT (optimized for low total BOM cost only). Thus, there exists a need for achieving, in discontinuous output voltage sensing DC-DC converters, light load efficiency associated with continuous output voltage systems with PFM.

SUMMARY

The present embodiments relate to methods and apparatuses for controlling DC-DC converters, for example a PFM control method for DC-DC regulators using discontinuous VOUT sensing. Present embodiments relate to pulse frequency modulation control for DC-DC regulators using discontinuous output voltage sensing, where input power in "standby" and "no load" modes can be adjusted or adjustably set by varying characteristics of various electrical components. Various electrical components include, but are not limited to, capacitors, resistors, inductors, AND gates, OR gates, NOT gates, amplifiers, operational amplifiers, comparators, transistors, and the like.

Exemplary embodiments may include a method of applying a charging pulse to an output capacitor, detecting satisfaction of a charging threshold, ending the charging pulse in response to the detecting the satisfaction of the charging threshold, and discharging the sampling capacitor in response to the detecting the satisfaction of the charging threshold. Exemplary embodiments may also include an apparatus with a controller coupled to an input node, a timer coupled to the controller, an inductive charger coupled to the controller, to an input node, and to an output node, and a sensor coupled to the controller and the output node. Exemplary embodiments may further include an apparatus where a sensor with a sampling capacitor has a first terminal coupled to the output node and a second terminal coupled to the controller and the inductive charger.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Figure 1:
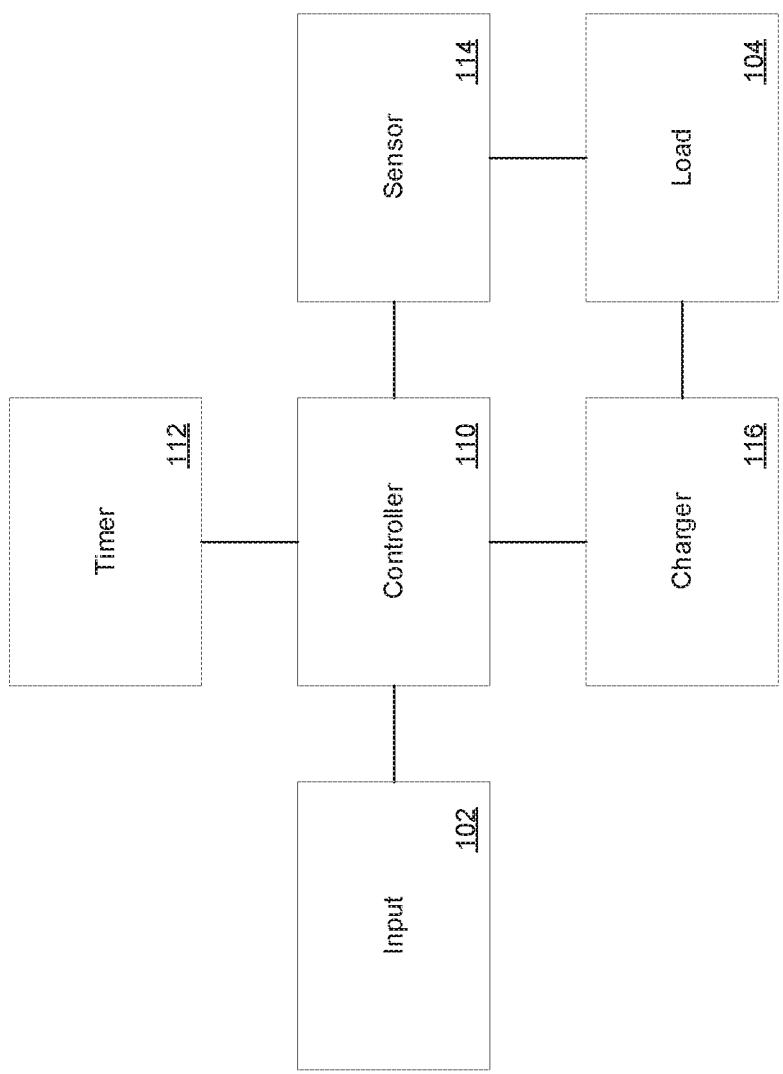
FIG. 1 illustrates an exemplary system in accordance with present embodiments.

FIG. 1 illustrates an exemplary system in accordance with present embodiments. As illustrated in FIG. 1, an exemplary system 100 includes an input 102, a load 104, a controller 110, a timer 112, a sensor 114, and a charger 116.

The input 102 may comprise a source of electrical power, voltage, current, or the like for supplying power to the system 100. In some embodiments, the input 102 includes, but is not limited to rectified 120 V AC power, rectified 220V-240V AC power, regulated power, unregulated power, or the like. In some embodiments, the input 102 may comprise a wired power connection, a wireless direct contact power connection, a wireless and contactless power connection, the like, or any power connection as is known or may become known.

The load 104 may comprise one or more electrical, electronic, electromechanical, electrochemical, or like devices or systems for receiving power, voltage, current, or the like from the charger 116 to perform one or more actions. In some embodiments, the load includes at least one battery, electronic display, electronic computer, electronic input device, electromechanical input device, electronic output device, electromechanical output device or the like. Examples of these devices include notebook computers, desktop computers, tablets, smartphones, printers, scanners, telephony endpoints, videoconferencing endpoints, keyboards, mice, trackpads, gaming peripherals, monitors, televisions, and the like. In some embodiments, the load 104 comprises one or more devices that are partially or fully separable from system 100. In some embodiments, the load 104 comprises one or more devices that are partially or fully integrated into system 100.

The controller 110 may comprise one or more logic devices for controlling operation of the charger. In some embodiments, the controller comprises one or more electrical components, general purpose electronic components, programmable electronic components, reprogrammable electronic components, or the like.

The timer 112 may comprise one or more electrical, electronic, electromechanical, electrochemical, or like devices or systems for measuring or indicating progress or expiration of a particular time period, time range, time point, time stamp, or the like. In some embodiments, the timer 112 may comprise a hardware counter or other digital logic.

The sensor 114 may comprise one or more electrical, electronic, electromechanical, electrochemical, or like devices or systems for detecting one or more electromagnetic characteristics of the input 102, the load 104, and the charger 116. Exemplary electromagnetic characteristics include but are not limited to voltage, current, power, capacitance, inductance, flux, or the like.

The charger 116 may comprise one or more electrical, electronic, electromechanical, electrochemical, or like devices or systems for charging the load 104. In some embodiments, the charger may comprise an inductive charger. An inductive charger may be, but is not limited to, a buck charger, a buck-boost charger, a flyback charger, a combination thereof, or the like.

Figure 2:
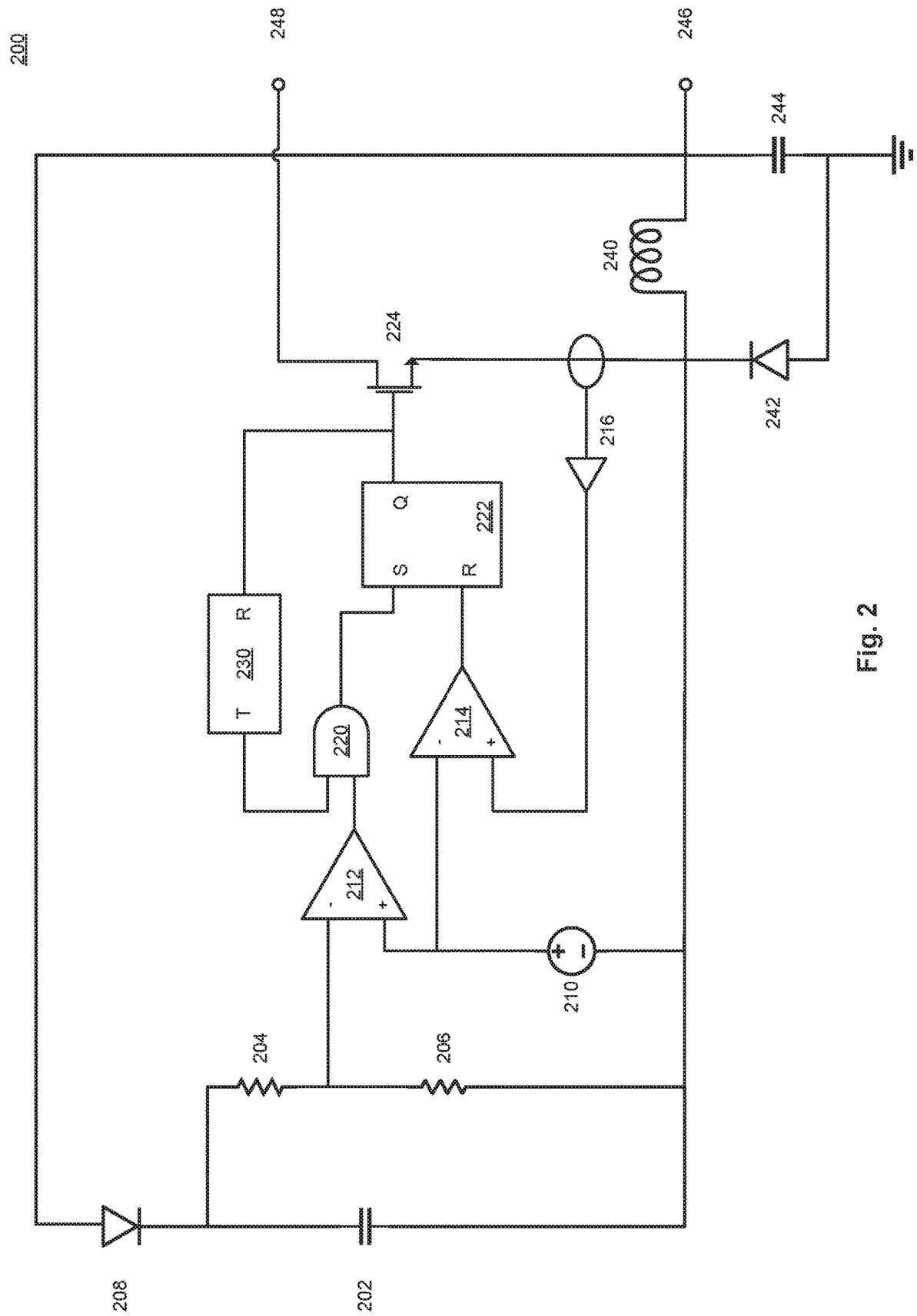
FIG. 2 illustrates an exemplary circuit apparatus in accordance with present embodiments.

FIG. 2 illustrates an exemplary circuit apparatus in accordance with present embodiments. As illustrated in FIG. 2, an exemplary system 200 includes an input portion, an output portion, a charger portion, a controller portion, a timer portion, and a sensor portion. In some embodiments, the exemplary system 200 may comprise one or more discrete electrical, electronic, or like elements assembled on a printed circuit board, a solderless circuit board (e.g., a "breadboard") or the like. In some embodiments, one or more elements of the exemplary system 200 may be fabricated in an integrated circuit or multiple integrated circuits assembled on a printed circuit board, a solderless circuit board, or the like. In some embodiments, one or more portions or components of the exemplary system 200 may be implemented in one or more programmable or reprogrammable devices or systems.

The input portion may comprise an input node 248 for receiving a supply voltage. In some embodiments, the input node 248 comprises a wired or wireless connection interface for receiving an input in accordance with the input 102. The output portion may comprise an output node 246 for supplying an output voltage. In some embodiments, the output node 246 comprises a wired connection interface for supplying an output in accordance with the load 104. In some embodiments, at least one of the input node 248 and the output node 246 includes one or more USB terminals or ports (e.g., USB-C ports).

The charger portion may comprise an inductor 240, an output diode 242, and an output capacitor 244. In some embodiments, the charger portion comprises a circuit, a device, a system, or the like, in accordance with the charger 116. The inductor 240 may have a first terminal operatively coupled to the output node 246 and a second node operatively coupled to a charger input node. The output diode 242 may have a cathode terminal operatively coupled to the charger input node and an anode terminal operatively coupled to a ground node. The output capacitor may have a first terminal operatively coupled to the output node 246 and a second terminal operatively coupled to the ground node. It is to be understood that the charger portion may include additional components to effect operation as a buck converter, a boost converter, a buck-boost converter, or the like. In some embodiments, the inductor 240 may comprise a transformer in a flyback converter. In some embodiments, the charger portion may include one or more switching transistors arranged with terminals operatively coupled to the inductor 240 in order to implement a buck converter, a boost converter, a buck-boost converter, or the like.

The controller portion may comprise a logic gate 220, a logic device 222 a switching transistor 224, for controlling pulse frequency, a precision voltage reference 210, a first comparator 212, a second comparator 214, and a current sensing amplifier 216 for sensing at least a charging threshold. In some embodiments, the controller portion comprises a circuit, a programmable device, a programmable system, or the like, in accordance with the controller 110. The logic gate 220 may be an AND gate or a functional equivalent thereof, may be a distinct circuit component or integrated with other circuits components. The logic gate 220 may include a first input terminal operatively coupled to an output terminal of the timer 230, a second input terminal operatively coupled to a component associated with the sensor portion, and an output terminal operatively coupled to the logic device 222. In some embodiments, the logic device 222 may be an SR flip flop, a functional equivalent thereof, or the like. The exemplary logic device 222 embodied as an SR flip flop may include a set input terminal ("S") operatively coupled to the output terminal of the logic gate 220, a reset input terminal ("R") operatively coupled to another component associated with the charge detection threshold portion, and a noninverted output terminal ("Q") operatively coupled to a control output node. In some embodiments, the switching transistor may be a FET, a MOSFET, power MOSFET, a BJT, a functional equivalent thereof, or the like. The exemplary switching transistor 224 embodied as a power MOSFET may include a gate terminal operatively coupled to the control output node, a drain terminal operatively coupled to the input node 248, and a source terminal operatively coupled to the charger input node. It is to be understood that the controller may be implemented in accordance with the present embodiments with any circuit, programmable device, programmable system, or plurality or combination thereof as are known or may become known.

The timer portion may comprise a timer 230 for generating a delay corresponding to a particular time period. In some embodiments, the timer portion comprises a circuit, a programmable device, a programmable system, or the like, in accordance with the timer 112. The timer 230 may include a timer output terminal ("T") operatively coupled to the first input node of the logic gate 220, and a reset terminal ("R") operably coupled to the control output node.

The precision voltage reference 210 may comprise a positive terminal operatively coupled to a second sensor node, and the precision voltage reference 210 may further comprise a negative terminal operatively coupled to the charger input node. In some embodiments, the precision voltage reference 210 is configured to set discharging and charging thresholds by coupling its positive terminal to the noninverting input of the first comparator 212 and the inverting input of the comparator 214. The first comparator 212 may comprise an inverting input terminal operatively coupled to the first sensor node, a noninverting input terminal operatively coupled to the second sensor node, and an output terminal operatively coupled to the second input of the logic gate 220. The second comparator 214 may comprise an inverting input terminal operatively coupled to the second sensor node, a noninverting input terminal operatively coupled to the current sensing amplifier 216, and an output terminal operatively coupled to the reset terminal of the logic device 222. The current sensing amplifier 216 may comprise an output terminal operatively coupled to the noninverting input terminal of the second comparator 214, and an input terminal operatively coupled to the charger input node. In some embodiments, the current sensing amplifier 216 operatively senses current through the switching transistor 224. In some embodiments, the current sensing amplifier 216 may comprise or be substituted with a constant-on timer (COT). In some embodiments, the COT is adaptive to one or more of input and output voltages.

The charge detection threshold portion may comprise a sampling capacitor 202, a voltage divider circuit including resistors 204 and 206, and a feedback diode 208. In some embodiments, the charge detection threshold portion comprises a circuit, a programmable device, a programmable system, or the like, in accordance with the sensor 114. The sampling capacitor 202 may have a first terminal operatively coupled to a feedback node, and a second node operatively coupled to the charger input node. In some embodiments, the sampling capacitor 202 may be an adjustable- or variable-capacitance capacitor. The resistors 204 and 206 of an exemplary voltage divider circuit may be arranged in series with each other and in parallel with the sampling capacitor 202. The resistor 204 may comprise a first terminal operatively coupled to the feedback node, and a second terminal operatively coupled to a first sensor node. The resistor 206 may comprise a first terminal operatively coupled to the first sensor node and a second terminal operatively coupled to the charger input node. The feedback diode 208 may comprise a cathode terminal operatively coupled to the feedback node, and an anode terminal operatively coupled to the output node 246. It is to be understood that the nodes described herein may include therein various electronic components, and are not limited to direct electrical connections between the exemplary components described herein.

Figure 3:
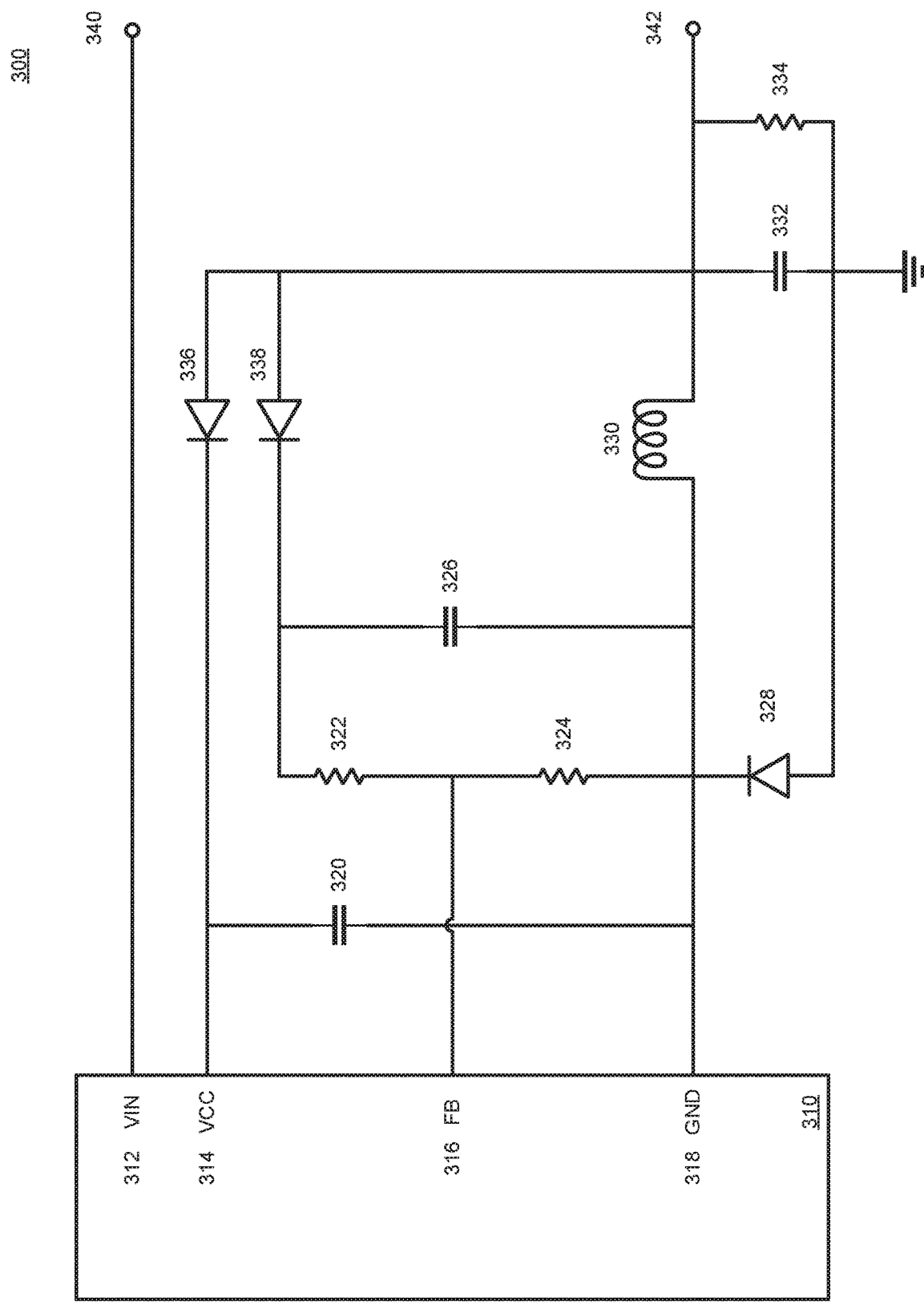
FIG. 3 illustrates an exemplary integrated circuit apparatus in accordance with present embodiments.

FIG. 3 illustrates an exemplary integrated circuit apparatus in accordance with present embodiments. As illustrated in FIG. 3, an exemplary system 300 includes an input portion, an integrated circuit portion, a circuit portion, and an output portion. In some embodiments, the exemplary system 300 includes a regulator using a floating topology, where ground of an integrated circuit portion is operatively coupled to a non-ground charger input node. In some embodiments, the exemplary system 300 may comprise one or more discrete electrical, electronic, or like elements assembled on a printed circuit board, a solderless circuit board (e.g., a "breadboard") or the like. In some embodiments, one or more elements of the exemplary system 300 may be fabricated in an integrated circuit or multiple integrated circuits assembled on a printed circuit board, a solderless circuit board, or the like. In some embodiments, one or more portions or components of the exemplary system 300 may be implemented in one or more programmable or reprogrammable devices or systems.

The input portion may comprise an input node 340 for receiving a supply voltage. In some embodiments, the input node 340 comprises a wired or wireless connection interface for receiving an input in accordance with the input 102 or the input node 248. The output portion may comprise an output node 342 for supplying an output voltage. In some embodiments, the output node 342 comprises a wired connection interface for supplying an output in accordance with the load 104 or the output node 246. In some embodiments, at least one of the input node 340 and the output node 342 includes one or more USB terminals or ports (e.g., USB-C ports).

The integrated circuit portion may comprise at least one integrated circuit 310 including an input voltage pin 312, an IC supply input pin 314, a feedback pin 316, and an IC ground pin 318. In some embodiments, the integrated circuit 310 may be a Renesas Electronics™ RAA223011 low power offline regulator operable to receive rectified universal AC input (e.g., 85V AC to 265V AC), and output 12V DC output, among others. In some embodiments, the integrated circuit 310 may be one or more of a Monolithic Power Systems™ MP174, a Power Integrations™ LinkSwitch-TN2, a Power Integrations™ LinkZero-AX, and an NXP Semiconductors™ TEA172x class integrated circuit. The integrated circuit 310 may comprise at least one integrated circuit for implementing at least a portion of the system 100 or the system 200. The input voltage pin 312 may be operatively coupled to the input node 340. In some embodiments, the IC supply input pin 314 may be operatively coupled to a circuit supply node. In some embodiments, the IC supply input pin 314 The IC supply input pin 314 may be operatively coupled to a circuit that supplies the IC from the output node 342. The feedback pin 316 may be operatively coupled to a feedback node. The IC ground pin 318 may be operatively coupled to a charger input node.

The circuit portion may comprise an IC supply decoupling capacitor 320, a voltage divider circuit including resistors 322 and 324, a sampling capacitor 326, an output diode 328, an inductor 330, an output capacitor 332, an output resistor 334, a supply diode 336, and a feedback diode 338. The IC supply decoupling capacitor 320 may have a first terminal operatively coupled to the circuit supply node, and a second terminal operatively coupled to the charger input node. The sampling capacitor 326 may comprise a first terminal operatively coupled to a sampling node and a second terminal operatively coupled to the charger input node. In some embodiments, the sampling capacitor 326 may be an adjustable- or variable-capacitance capacitor. The resistors 322 and 324 of an exemplary voltage divider circuit may be arranged in series with each other and in parallel with the sampling capacitor 326. The resistor 322 may comprise a first terminal operatively coupled to the sampling node, and a second terminal operatively coupled to the feedback node. The resistor 324 may comprise a first terminal operatively coupled to the feedback node and a second terminal operatively coupled to the charger input node.

The output diode 328 may comprise a cathode terminal operatively coupled to the charger input node, and an anode terminal operatively coupled to a ground node. The output capacitor 332 may comprise a first terminal operatively coupled to the output node 342, and a second terminal operatively coupled to the ground node. The supply diode 336 may comprise a cathode terminal operatively coupled to the circuit supply node, and an anode terminal operatively coupled to the output node 342. The feedback diode 338 may comprise a cathode terminal operatively coupled to the sampling node, and an anode terminal operatively coupled to the output node 342. The output resistor 334 may comprise a first terminal operatively coupled to the output node 342, and a second terminal operatively coupled to the ground node.

The inductor 330 may have a first terminal operatively coupled to the output node 342 and a second node operatively coupled to the charger input node. It is to be understood that the circuit portion may include additional components to effect operation as a buck converter, a boost converter, a buck-boost converter, or the like. In some embodiments, the inductor 330 may comprise a transformer in a flyback converter. In some embodiments, the circuit portion may include one or more switching transistors arranged with terminals operatively coupled to the inductor 330 in order to implement a buck converter, a boost converter, a buck-boost converter, or the like.

Figure 4:
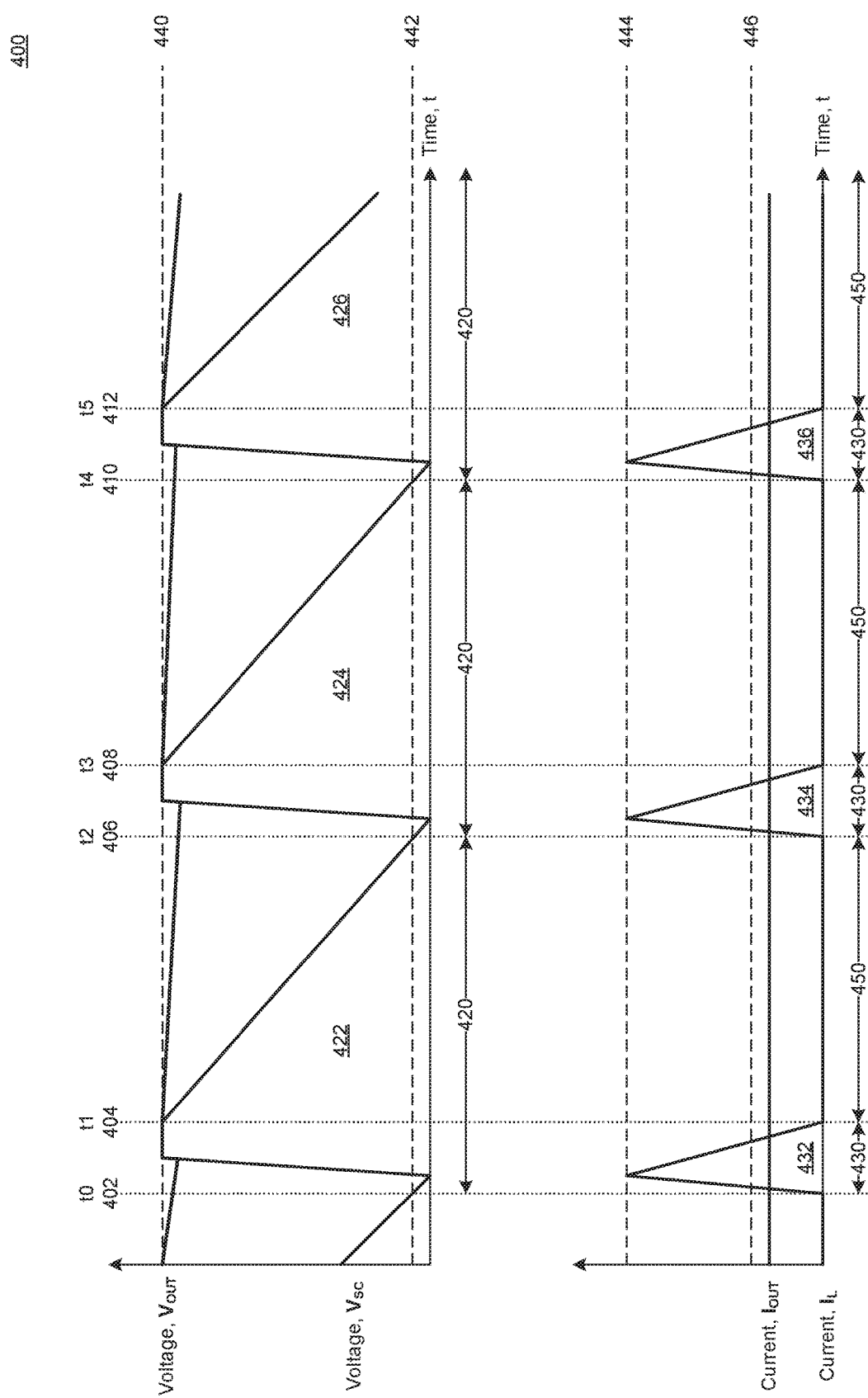
FIG. 4 illustrates exemplary timing diagrams including sampling capacitor voltage magnitude and charging pulse current magnitude in accordance with present embodiments.

FIG. 4 illustrates exemplary timing diagrams including sampling capacitor voltage magnitude and charging pulse current magnitude in accordance with present embodiments. As illustrated by way of example in FIG. 4, an exemplary system may operate according to voltage and current timing in exemplary timing diagrams 400. An exemplary voltage across a sampling capacitor ($V_{SC}$) varies from time t0 402 through time t5 412. Concurrently, an output voltage at a load or output node ($V_{OUT}$) varies from time t0 402 through time t5 412. Concurrently, an exemplary charger current ($I_L$) can be measured from time t0 402 to time t5 412. Concurrently an exemplary output current at the load or the output node ($I_{OUT}$) is substantially constant and present from time t0 402 through time t5 412. The exemplary system may undergo multiple sequential cycles in accordance with present embodiments.

At time t0 402, a first voltage regulation period 420 begins, a first sampling capacitor charge-discharge cycle 422 begins, a first burst period 430 begins, and a first charging pulse 432 begins. At time t0, $V_{OUT}$ is decreasing from a sensed output voltage level corresponding to a peak output voltage level 440, and the exemplary system detects that $V_{SC}$ is less than or equal to a voltage threshold 442, and the exemplary system begins the charging pulse 432 having a magnitude equal to a peak current threshold 444. In response to the first charging pulse 432, $V_{SC}$ increases toward the peak output voltage level 440. $V_{OUT}$ stops decreasing and begins increasing to the peak output voltage level 440 when $V_{SC}$ essentially equals, equals or exceeds $V_{OUT}$. In some embodiments, $V_{OUT}$ and $V_{SC}$ remain equal after $V_{SC}$ increases to equal $V_{OUT}$ and continues increasing to the peak voltage level 440, until time t1 404. At time t1 404, the first burst period 430 ends, the first charging pulse 432 ends, and a first sampling capacitor discharge period 450 begins. The first charging pulse 432 ends when $V_{SC}$ increases to equal the peak voltage output level 440. In response, $V_{OUT}$ stops increasing and begins decreasing. At time t2 406, the first voltage regulation period 420 ends, the first sampling capacitor charge-discharge cycle 422 ends, and the first sampling capacitor discharge period 450 ends. $V_{OUT}$ continues decreasing. In addition, a second voltage regulation period 420 begins, a second sampling capacitor charge-discharge cycle 424 begins, a second burst period 430 begins, and a second charging pulse 434 begins.

The exemplary system may thus repeat operation according to the first sampling capacitor charge-discharge cycle 422 in subsequent cycles. Operation of the exemplary system at time t2 406 and time t4 410 may correspond to operation at time t0 402. Further, operation of the exemplary system at time t3 408 and time t5 412 may correspond to operation at time t1 404. Thus, second and third sampling capacitor charge-discharge cycles 424 and 426 may operate correspondingly to the first sampling capacitor charge-discharge cycle 422. In addition, second and third charging pulses may operate correspondingly to the first charging pulse 432. Alternatively, charging pulse comprises a charging timer during which a charging pulse exists.

In exemplary embodiments, $V_{SC}$ decays faster that than $V_{OUT}$, to prevent voltage across the sampling capacitor 202 from exceeding the peak voltage output level 440. If the voltage across the sampling capacitor 202 exceeds the peak output voltage level 440 in various embodiments, the feedback diode 208 will not activate to begin a charging cycle of any of the charge-discharge cycle 422, 424 or 426, and sampling may not occur. Therefore, it can be understood that:

$$\frac{\Delta V}{\Delta I} \approx \frac{V_{OUT}}{C_S(R_1+R_2)} \geq \frac{I_{OUT,max}}{C_{OUT}} \quad \text{Eq. (1)}$$

An exemplary ripple voltage across an exemplary sampling capacitor corresponds to a difference between the peak output voltage level 440 and a voltage threshold 442. The threshold voltage may be a function of a precision reference voltage and a voltage divider circuit. Thus:

$$\Delta V = V_{OUT} - V_{TH} \quad \text{Eq. (2)}$$

$$V_{TH} = \frac{R_1+R_2}{R_2} V_{REF} \quad \text{Eq. (3)}$$

An exemplary output current $I_{OUT}$, can be understood with respect to an inductor peak current $I_{PEAK}$, a switching period T, an "on-off" period $T_P$ comprising an "on" time $T_{ON}$ and an "off" time $T_{OFF}$, and an inductance L, by:

$$I_{OUT} = \frac{T_P I_{PEAK}}{2T} = \frac{(T_{ON}+T_{OFF})I_{PEAK}}{2T} =$$

$$\frac{\left(\frac{LI_{PEAK}}{V_{IN}-V_{OUT}} + \frac{LI_{PEAK}}{V_{OUT}}\right)I_{PEAK}}{2T} = \frac{LI_{PEAK}^2}{2TV_{OUT}\left(1-\frac{V_{OUT}}{V_{IN}}\right)} \quad \text{Eq. (4)}$$

An exemplary minimum input power $P_{IN,min}$ is based on a minimum output current $I_{OUT,min}$. As an exemplary sampling capacitor discharges to a minimum current level, time increases. To discharge an exemplary sampling capacitor sufficiently to $I_{OUT,min}$, a maximum time period $T_{MAX}$ may elapse. Thus, an exemplary output current $I_{OUT,min}$, $I_{PEAK}$, and $T_{MAX}$ may all be understood as:

$$I_{OUT,min} = \frac{LI_{PEAK}^2}{2T_{MAX}V_{OUT}\left(1 - \frac{V_{OUT}}{V_{IN}}\right)} \quad \text{Eq. (5)}$$

$$I_{PEAK} = \frac{T_{ON}}{L}(V_{IN} - V_{OUT}) \quad \text{Eq. (6)}$$

$$T_{MAX} \leq \frac{\Delta V C_{OUT}}{I_{OUT,max}} \quad \text{Eq. (7)}$$

Based on the above exemplary Eqs. (5), (6) and (7), and an exemplary power supply efficiency it may be understood that:

$$C_{OUT} \geq \frac{I_{OUT,max}}{I_{OUT,min}} \frac{V_{IN}}{\Delta V} \frac{T_{ON}^2}{2L}\left(\frac{V_{IN}}{V_{OUT}} - 1\right) \quad \text{Eq. (8)}$$

$$P_{IN,min} = \frac{P_{OUT,min}}{\eta} \rightarrow I_{OUT,min} = \frac{\eta P_{IN,min}}{V_{OUT}} \quad \text{Eq. (9)}$$

$$C_{OUT} \geq \frac{I_{OUT,max}}{\eta P_{IN,min}} \frac{V_{IN}}{\Delta V} \frac{T_{ON}^2}{2L}(V_{IN} - V_{OUT}) \quad \text{Eq. (10)}$$

Thus, as $P_{IN,min}$ decreases, $C_{OUT}$ increases. Exemplary embodiments, in accordance with Eq. (10), may set or select a desired $P_{IN,min}$ by varying the value of $C_{OUT}$ in an exemplary output capacitor. A value of $C_{OUT}$ satisfying a desired $P_{IN,min}$ may then be applied to Eq. (1) to set or select values for the voltage divider resistors $R_1$ and $R_2$ and the sampling capacitor Cs in exemplary embodiments. The exemplary systems 100, 200 and 300 may be embodied in accordance with at least one of Eqs. (1)-(10). This way, $P_{IN,min}$ can be adjusted externally, without additional pins and without additional external components.

Figure 5:
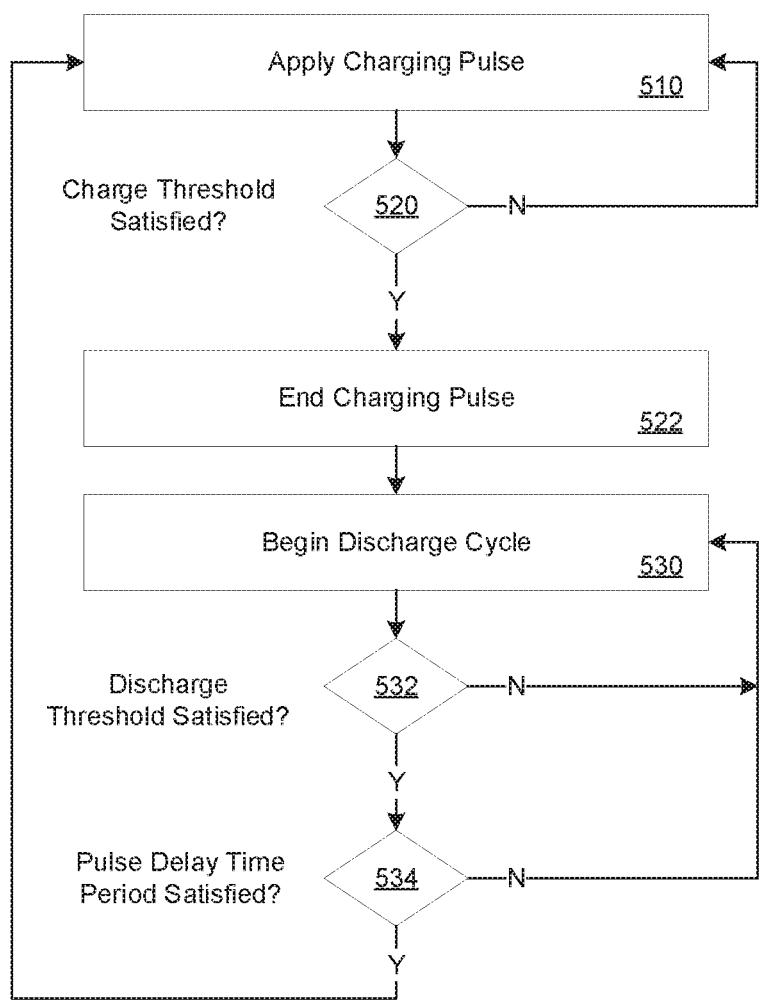
FIG. 5 illustrates an exemplary method of applying a charging pulse in accordance with the exemplary timing diagrams of FIG. 4.

FIG. 5 illustrates an exemplary method of applying a charging pulse to an output capacitor in accordance with the exemplary timing diagrams of FIG. 4. In some embodiments, one of the exemplary systems 100, 200 or 300 performs method 500 according to present embodiments. In some embodiments, regulation of charging pulse timing and charging-discharge cycles is based on ripple voltage of the exemplary sampling capacitor 202 of FIG. 2.

At step 510, an exemplary system applies a charging pulse. In the exemplary system 200, the switching transistor 224 is activated, and inductor current ramps up. The method then continues to step 520.

At step 520, the exemplary system detects whether inductor current satisfies a current threshold. In some embodiments, the current threshold corresponds to IPEAK. In some embodiments, a charge pulse is defined by a timer circuit, timer logic, or the like. The method 500 continues to step 522. Alternatively, if the exemplary system does not detect that the inductor current satisfies $I_{PEAK}$ threshold, or detects that the voltage across the sampling capacitor does not satisfy the maximum voltage threshold, the method 500 continues to step 510.

At step 522, the exemplary system ends the charging pulse. The method 500 then continues to step 530.

At step 530, the exemplary system begins a discharge cycle. During this time, the sampling capacitor 202 slowly discharges through the resistors 204 and 206. Concurrently, the output capacitor 244 slowly discharges as well. The method then continues to step 532.

At step 532, the exemplary system detects whether voltage across the sampling capacitor 202 drops below a voltage threshold. In some embodiments, the voltage threshold corresponds to the discharge threshold, and further corresponds to $V_{TH}$ of Eq. (3). The method then continues to step 534. Alternatively, if the exemplary system does not detect that the voltage across the sampling capacitor does not satisfy the satisfy the charging threshold, the method 500 continues to step 530.

At step 534, the exemplary system detects whether delay timer has satisfied a delay time period. In some embodiments, the delay timer defines a minimum capacitor discharge period. In some embodiments, the minimum capacitor discharge period corresponds to the capacitor discharge period 450, and defines a maximum switching frequency comprising the first burst period 430 and the capacitor discharge period 450. If the exemplary system detects that the delay timer satisfies the delay time period, then the method continues to step 510. Alternatively, if the exemplary system does not detect that the delay timer satisfies the delay time period, or detects that the delay timer does not satisfy the delay time period, the method 500 continues to step 530.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An apparatus comprising:
    a controller coupled to an input node;
    a timer coupled to the controller;
    an inductive charger coupled to the controller, to an input node, and to an output node;
    a sampling capacitor having a first terminal coupled to the output node and a second terminal coupled to the controller and the inductive charger;
    a voltage divider circuit coupled in parallel to the sampling capacitor;
    a first comparator having a first input terminal coupled to a third node of the voltage divider circuit, a second input terminal coupled to a charger input node, and an output terminal coupled to the controller;
    a current sensor having a first terminal coupled to at least one of the controller and the inductive charger; and
    a second comparator having a first input terminal coupled to the charger input node, a second input terminal coupled to a second terminal of the second comparator, and an output terminal coupled to the controller.

2. The apparatus of claim 1, wherein the controller comprises a first logic device and a second logic device,
    wherein the first logic device has a first input terminal coupled to an output terminal of the timer, a second input terminal coupled to the first comparator, and an output terminal, and
    wherein the second logic device has a first input terminal coupled to the output terminal of the first logic device, a second input terminal coupled to the second comparator, and an output coupled to the timer and the inductive charger.

3. The apparatus of claim 2, wherein the controller further comprises a switching transistor having a first terminal coupled to the output of the second logic device and the timer, a second terminal coupled to the first terminal of the inductor and a third terminal coupled to the input node.

4. The apparatus of claim 1, wherein the inductive charger comprises an inductor having a first terminal coupled to the controller and having a second terminal coupled to the output node.

5. A system comprising:
    a controller coupled to an input node;
    a timer coupled to the electrical controller;
    an inductive charger coupled to the electrical controller, to an input node, and to an output node;
    a sampling capacitor having a first terminal coupled to the output node and a second terminal coupled to the controller and the inductive charger;
    a voltage divider circuit coupled in parallel to the sampling capacitor;
    a first comparator having a first input terminal coupled to a third node of the voltage divider circuit, a second input terminal coupled to a charger input node, and an output terminal coupled to the controller;
    a current sensor having a first terminal coupled to at least one of the controller and the inductive charger; and
    a second comparator having a first input terminal coupled to the charger input node, a second input terminal coupled to a second terminal of the second comparator, and an output terminal coupled to the controller.

6. The system of claim 5, wherein the controller comprises a first logic device and a second logic device, wherein the first logic device has a first input terminal coupled to an output terminal of the timer, a second input terminal coupled to the first comparator, and an output terminal, and wherein the second logic device has a first input terminal coupled to the output terminal of the first logic device, a second input terminal coupled to the second comparator, and an output coupled to the inductive charger.

7. The apparatus of claim 1, wherein the sampling capacitor, the voltage divider circuit, the first comparator, the current sensor, and the second comparator comprise a sensor.

8. The apparatus of claim 1, wherein satisfaction of a discharging threshold is detected based on a voltage at the sampling capacitor.

9. The apparatus of claim 8, wherein the discharging threshold comprises a voltage based on an output of the voltage divider circuit.

10. The apparatus of claim 1, wherein satisfaction of a charging threshold is detected based on a current at the inductive charger.

11. The system of claim 5, wherein the sampling capacitor, the voltage divider circuit, the first comparator, the current sensor, and the second comparator comprise a sensor.

12. The system of claim 5, wherein satisfaction of a discharging threshold is detected based on a voltage at the sampling capacitor.

13. The system of claim 12, wherein the discharging threshold comprises a voltage based on an output of the voltage divider circuit.

14. The system of claim 5, wherein satisfaction of a charging threshold is detected based on a current at the inductive charger.

* * * * *